(12) United States Patent
Ma et al.

(10) Patent No.: US 7,830,208 B2
(45) Date of Patent: Nov. 9, 2010

(54) HIGH-POWER COMMON-BASE AMPLIFIER EMPLOYING CURRENT SOURCE OUTPUT BIAS

(75) Inventors: Zhenqiang Ma, Middleton, WI (US); Guogong Wang, Tempe, AZ (US); Guoxuan Qin, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 0 days.

(21) Appl. No.: 12/233,307

(22) Filed: Sep. 18, 2008

(65) Prior Publication Data

US 2010/0066454 A1    Mar. 18, 2010

(51) Int. Cl.
*H03F 3/04*    (2006.01)

(52) U.S. Cl. ...................................... 330/296; 330/285
(58) Field of Classification Search ................. 330/296, 330/285, 288
See application file for complete search history.

(56) References Cited

U.S. PATENT DOCUMENTS

| 3,531,732 | A | * | 9/1970 | Thompson | 330/282 |
| 3,786,361 | A | * | 1/1974 | Beurrier | 330/311 |
| 4,250,462 | A | * | 2/1981 | Iwer et al. | 330/296 |
| 4,379,996 | A | * | 4/1983 | Weber | 330/296 |
| 4,538,118 | A | * | 8/1985 | Lorieux | 330/286 |
| 4,731,574 | A | * | 3/1988 | Melbert | 323/275 |
| 5,281,925 | A | * | 1/1994 | Hulick | 330/296 |
| 5,966,051 | A | * | 10/1999 | Griffith et al. | 330/285 |
| 6,535,067 | B1 | * | 3/2003 | Petrosky | 330/285 |
| 2005/0151159 | A1 | | 7/2005 | Ma et al. | |
| 2006/0267148 | A1 | | 11/2006 | Ma et al. | |
| 2007/0007626 | A1 | | 1/2007 | Ma et al. | |

OTHER PUBLICATIONS

Li, Hui, et al., Fundamental Difference of Power Handling Between CE and CB HBTs, *Digest of Papers of 2006 28th IEEE Compound Semiconductor IC (CSIC) Symposium*, San Antonio, TX, Nov. 12-15, 2006, pp. 183-186, IEEE, New York, New York, USA.

* cited by examiner

*Primary Examiner*—Henry K Choe
(74) *Attorney, Agent, or Firm*—Boyle Fredrickson, S.C.

(57) ABSTRACT

A common-base amplifier for a bipolar junction transistor or a heterojunction bipolar transistor employs an active current source output biasing to provide for improved power output in a power saturation region providing increased power for a given transistor area such as may be advantageous in mobile radio transmitters or the like.

16 Claims, 2 Drawing Sheets

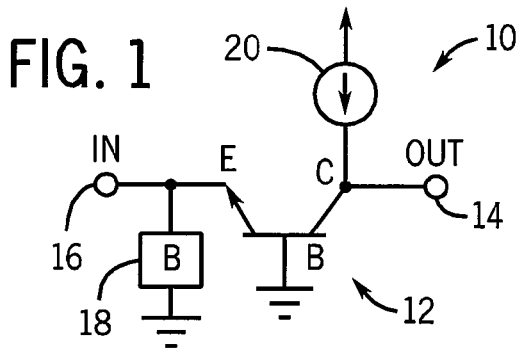
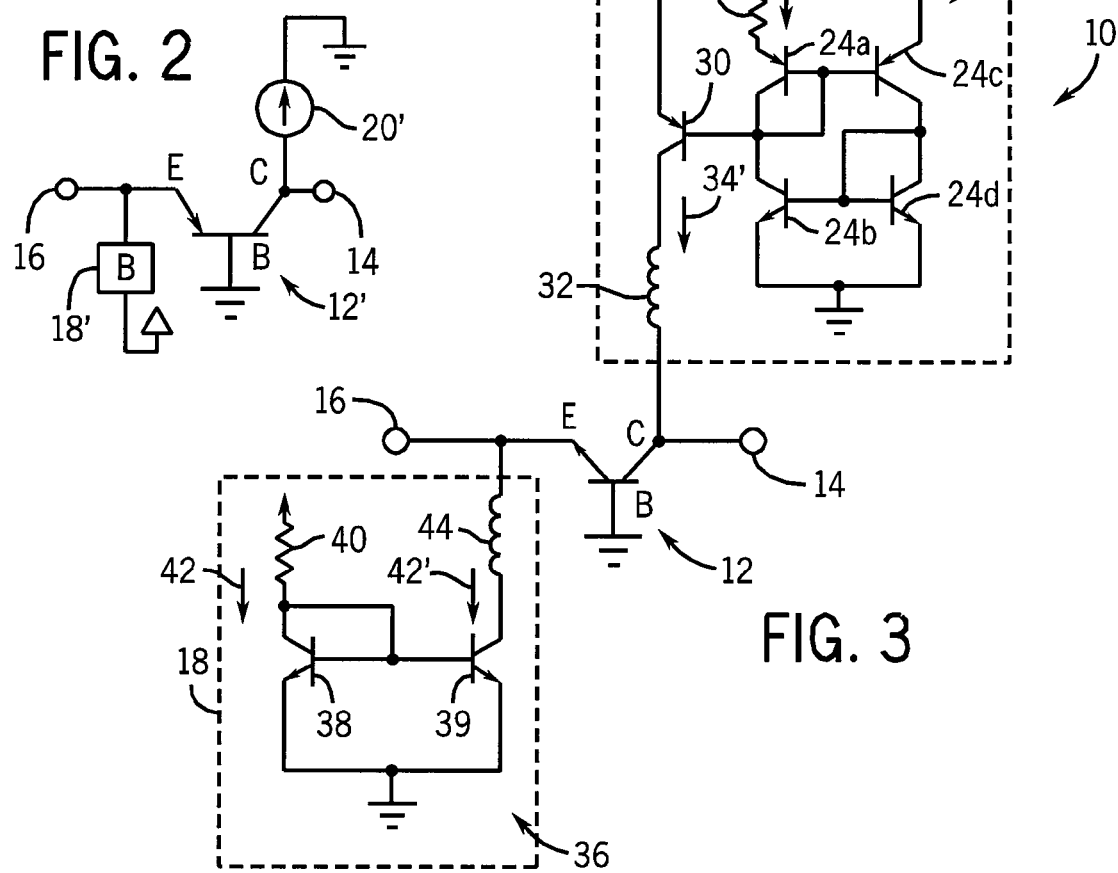
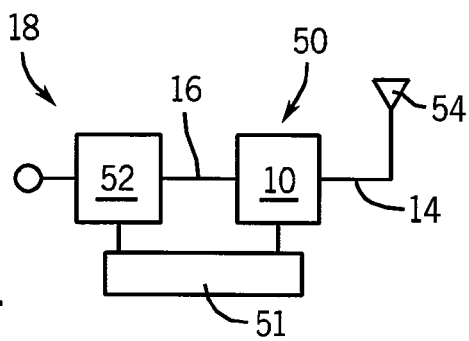

HIGH-POWER COMMON-BASE AMPLIFIER EMPLOYING CURRENT SOURCE OUTPUT BIAS

STATEMENT REGARDING FEDERALLY SPONSORED RESEARCH OR DEVELOPMENT

This invention was made with the United States government support awarded by the following agency:

NSF 0323717

The United States government has certain rights in this invention.

BACKGROUND OF THE INVENTION

The present invention relates to transistor amplifiers and in particular to a high-power amplifier employing heterojunction bipolar transistors (HBTs) with common-base (CB) configurations.

High power amplification at high frequencies, for example, such as is required for radio frequency communication, often uses heterojunction bipolar transistors (HBTs) in the final power stages of the signal amplification. HBTs differ from bipolar junction transistors (BJTs) in that HBTs use different materials for the emitter and bass regions creating a heterojunction. This improvement generally increases the operating frequency of the transistor up to several hundred gigahertz.

Generally the power handling capability of any transistor depends to a first order on the area of the transistor on the substrate. Increased demand for miniature radio transmitters having decreased power consumption places a premium on minimizing the area required for the transistor devices. Accordingly it is desirable to produce transistor amplifiers having the greatest possible power handling capability for a given transistor area.

Two common power amplifier configurations are the common-base (CB) and common-emitter (CE) configurations. In the common-base configuration, the input signal is applied to the emitter of the transistor and the base is at signal ground. In the common-emitter configuration, the input signal is applied to the base of the transistor and the emitter is at signal ground. In both cases the output signal may be obtained at the collector of the transistor.

For transistors of the same size, it was widely believed that CB and CE amplifiers should provide identical power. In this case, CB transistors may be preferred for some high-frequency circuits because this configuration provides high voltage gain even at high frequencies where current gain quickly drops for the corresponding CE transistors that have smaller voltage gain than CB transistors. See, for example, co-pending U.S. application Ser. No. 11/178,644 entitled: "High-Power-Gain, Bipolar Transistor Amplifier" filed Jul. 11, 2005, assigned to the same assignee as the present invention and hereby incorporated by reference.

Surprisingly, present inventors determined that the power handling capabilities for HBTs are significantly affected by whether they are used in a CB or CE configuration. In particular, in voltage source biasing, CE amplifiers always provide higher (saturated) output power than CB configurations.

This finding is discussed in H. Li, N. Jiang, G. Wang and Z. Ma, *Fundamental Difference of Power Handling Between CE and CB HBTs*, Digest of Papers of 2006, 28th IEEE Compound Semiconductor IC (CSIC) Symposium, San Antonio, Tex., Nov. 12-15, 2006, pp. 183-186.

SUMMARY OF THE INVENTION

The present inventors have now determined that at high power (saturating) operating conditions, CB configurations, in fact, will outperform common-emitter amplifier configurations if an active current source biasing is used to bias the output of the amplifier. This significant improvement in power handling capacity for an arbitrary HBT has great significance in the manufacture of portable radio frequency amplifiers and the like.

Specifically, the present invention provides a common-base transistor amplifier having a heterojunction bipolar transistor receiving an input signal at an emitter of the transistor and providing an output signal at the collector of the transistor, the output signal having amplified power with respect to the input signal, and having the base of the transistor at signal ground. An active current source circuit provides a source of substantially constant current to the collector and a bias circuit providing a bias current to the emitter.

Thus it is an object of least one embodiment of the invention to provide for increased power handling for HBT transistor amplifiers without changing the HBT device, and most significantly without increasing the area of the device.

The bias circuit may be an active current source circuit providing a source of substantially constant current to the emitter.

It is thus another object of least one embodiment of the invention to provide an amplifier circuit permitting flexible selection of an input biasing system.

The active current source may be a transistor current mirror employing either HBTs or FETs or the like.

It is thus another object of least one embodiment of the invention to provide for a simple active current source that may be used in integrated circuit manufacture.

The input signal is in excess of 100,000 Hz.

It is thus an object of least one embodiment of the invention to provide for an amplifier particularly suited for portable radio frequency applications where high power and low transistor area are desired.

These particular features and advantages may apply to only some embodiments falling within the claims and thus do not define the scope of the invention.

BRIEF DESCRIPTION OF THE DRAWINGS

FIGS. 1 and 2 are simplified schematics of the amplifier of the present invention employing a PNP and NPN HBT transistor respectively;

FIG. 3 is a detailed schematic of the circuit of FIG. 1 showing current mirrors for biasing the output and input;

FIG. 4 is a block diagram of a portable radio transmitter suitable for use with the present invention;

DETAILED DESCRIPTION OF THE PREFERRED EMBODIMENT

Figure 5:
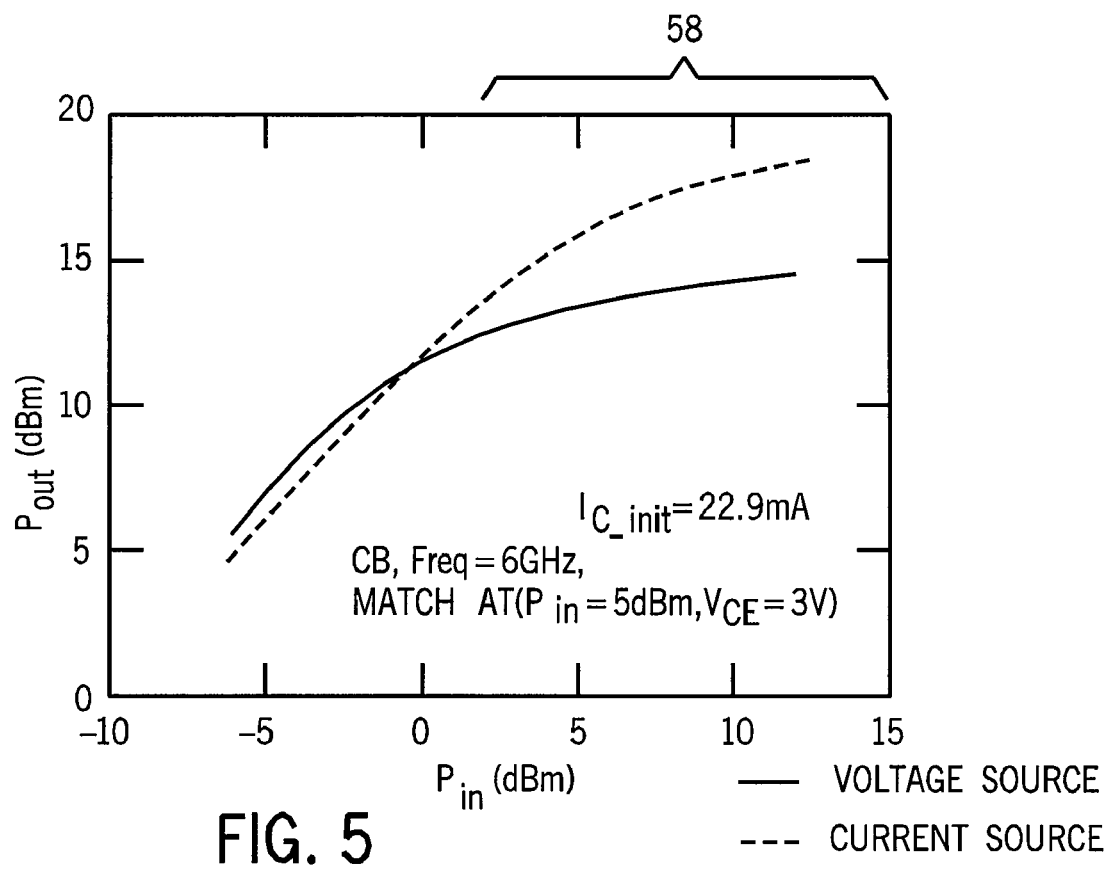
FIG. 5 is a plot showing improved power at saturation levels for the inventive active current source biasing in contrast to conventional voltage source biasing.

Referring now to FIG. 1, the present invention provides an amplifier 10 including an NPN heterojunction bipolar transistor 12 having a collector, base and emitter terminal, labeled C, B, and E respectively.

According to typical common-base configuration, the base of the transistor 12 is connected to signal ground (possibly through one or more passive components), the collector of the transistor 12 is connected to an output terminal 14 (from which an amplified radiofrequency signal will be obtained), and the emitter of the transistor 12 is connected to an input terminal 16 at which an input signal is applied. An input bias circuit 18 of a type generally known in the art biases the emitter of the transistor 12 with respect to its base within the operating range of the transistor 12.

In the present invention, the collector of the transistor 12 is biased by an active current source 20 in distinction from a voltage source under voltage source biasing. A variable current to the collector is supplied as a function of the output power (at the output terminal 14). In contrast, the active current source 20 delivers a substantially constant current to the collector of the transistor 12 regardless of the output power.

Referring to FIG. 2, the present invention can alternatively be used with a PNP transistor 12' having the same components and connections as described with respect to FIG. 1 with the exception that the active current source 20 and bias circuit 18 conduct current in the opposite directions as those described with respect to FIG. 1. Adopting a typical convention it will be considered that the active current source 20 and the bias circuit 18 both "provide" current to the transistor 12 or 12' with the sign of the current simply being reversed to indicate its flow direction.

Referring now to FIG. 3, the active current source 20 may be a current mirror 22, in this case in the form of a so-called "Wilson" current mirror having four transistors to provide increased immunity from base current mismatch and to provide improved linearity. The current mirror 22 generates a constant current 34 through series connected transistors 24a, 24b and 24c and 24d according to well-known principles, the magnitude of the current 34 as set by resistor 26 and the value of the supply voltage 28. An additional buffer transistor 30 "reflects" this current 34 as current 34' through a choke 32 which connects in turn to the collector of the transistor 12. Thus, within the intended operating range of the amplifier 10, the collector of transistor 12 receives a constant current 34 largely independent of the voltage on the output terminal 14. It will be understood that the transistors used in the current source 20 may be any type of transistor including BJTs, HBTs, and FETs. Because the current source 20 delivers a constant current, high-speed performance is not required of its transistors.

The bias circuit 18 connected to the emitter of the transistor 12 may be a simple resistor or inductor (not shown) to provide the necessary bias current. In the preferred embodiment, however, this bias circuit 18 is a second simplified current mirror 36 having a first transistor 38 establishing a reference current 42 through resistor 40. The reference current 42 is mirrored as current 42' through transistor 39 and then through inductor 44 to be drawn from the emitter.

Referring now to FIG. 4, the amplifier 10 of the present invention may be used in a portable radio transmitter 48 having a battery supply 51 where it may provide for a RF power stage 50 accepting at the input terminal 16, a radiofrequency signal (above 100 kHz and up to 200 gigahertz) from a low RF power stage 52 which may, for example, provide an audio signal through an impedance matching circuit (not shown) from a user of a cell phone or a data signal generated by a wireless network card or the like. The output terminal 14 of the amplifier 10 maybe connected to an antenna 54 through another impedance matching circuit (not shown).

Referring now to FIG. 5, the common-base amplifier 10 using the active current source of the present invention provides for superior power in a saturation region 58.

Figure 6:
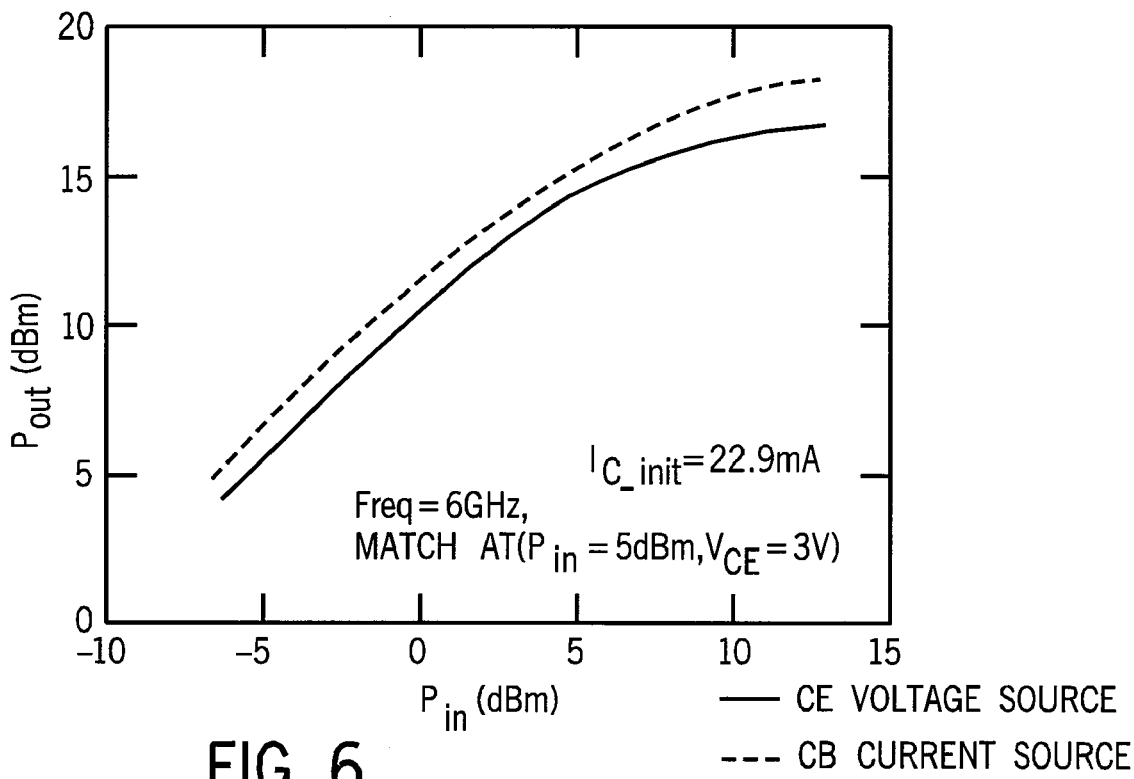
FIG. 6 is a figure similar to that of FIG. 5 showing the superiority of the present design to a common-emitter design under its preferred voltage source biasing.

Referring now to FIG. 6, the power output in a saturation region 58 using the common-base configuration and the active current source of the present invention is also superior to a common-emitter amplifier operating in its ideal mode of voltage source output biasing.

It is specifically intended that the present invention not be limited to the embodiments and illustrations contained herein, but include modified forms of those embodiments including portions of the embodiments and combinations of elements of different embodiments as come within the scope of the following claims.

We claim:

1. A common-base transistor amplifier comprising:
   a bipolar junction transistor (BJT) receiving an input signal at an emitter of the transistor and providing an output signal at a collector of the transistor, the output signal having amplified power with respect to the input signal, and having a base of the transistor substantially at a signal ground;
   an active current source circuit providing a source of substantially constant current to the collector; and
   a bias circuit providing a bias current to the emitter;
   wherein the active current source is a transistor current mirror.

2. The common-base bipolar junction transistor amplifier of claim 1 wherein the bias circuit is an active current source circuit providing a source of substantially constant current to the emitter.

3. The common-base bipolar junction transistor amplifier of claim 1 wherein the bipolar junction transistor is a heterojunction bipolar transistor (HBT).

4. The common-base bipolar junction transistor amplifier of claim 1 wherein the active current source is constructed of bipolar transistors.

5. The common-base bipolar junction transistor amplifier of claim 1 wherein the active current source is constructed of FET transistors.

6. The common-base bipolar junction transistor amplifier of claim 1 wherein the input signal is in excess of 100,000 Hz.

7. The common-base bipolar junction transistor amplifier of claim 1 wherein the HBT transistor is an NPN transistor.

8. The common-base bipolar junction transistor amplifier of claim 1 wherein the HBT transistor is a PNP transistor.

9. A battery powered radio transmitter comprising:
   a low-power radio frequency generation circuit for encoding information on a radio frequency signal;
   a power amplifier receiving the radio frequency signal to communicate power to an antenna, the power amplifier having:
   (a) at least one bipolar junction transistor (BJT) receiving an input signal at an emitter of the transistor and providing an output signal at the collector of the transistor, the output signal having amplified power with respect to the input signal, and having a base of the transistor substantially at a signal ground;
   (b) an active current source circuit providing a source of substantially constant current to the collector; and
   (c) a bias circuit providing a bias current to the emitter;
   wherein the active current source is a transistor current mirror.

10. The radio transmitter of claim 9 wherein the bias circuit is an active current source circuit providing a source of substantially constant current to the emitter.

11. The radio transmitter of claim 9 wherein the bipolar junction transistor is a heterojunction bipolar transistor.

12. The radio transmitter of claim 9 wherein the active current source is constructed of bipolar transistors.

13. The radio transmitter of claim 9 wherein the active current source is connected FET transistors.

14. The radio transmitter of claim 9 wherein the input signal is in excess of 100,000 Hz.

15. The common-base bipolar junction transistor amplifier of claim 9 wherein the HBT transistor is an NPN transistor.

16. The common-base bipolar junction transistor amplifier of claim 9 wherein the HBT transistor is a PNP transistor.

* * * * *